United States Patent
Lin

(10) Patent No.: US 10,686,431 B1
(45) Date of Patent: Jun. 16, 2020

(54) HIGH-SENSITIVITY CLOCKED COMPARATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/656,801

(22) Filed: Oct. 18, 2019

(51) Int. Cl.
| | |
|---|---|
| *H03K 3/356* | (2006.01) |
| *H03K 3/0233* | (2006.01) |
| *H03F 3/45* | (2006.01) |
| *H03K 5/24* | (2006.01) |

(52) U.S. Cl.
CPC ... *H03K 3/356191* (2013.01); *H03F 3/45264* (2013.01); *H03K 3/0233* (2013.01); *H03K 3/02335* (2013.01); *H03K 3/356139* (2013.01); *H03K 5/249* (2013.01); *H03K 5/2481* (2013.01)

(58) Field of Classification Search
CPC ............ H03K 3/0233; H03K 3/02335; H03K 3/356043; H03K 3/356095; H03K 3/356139; H03K 3/356191; H03K 5/2481; H03K 5/249; H03F 3/45264
See application file for complete search history.

(56) References Cited

U.S. PATENT DOCUMENTS

| | | | | |
|---|---|---|---|---|
| 7,629,817 | B2* | 12/2009 | Nedovic | H03K 17/6871 327/211 |
| 8,514,117 | B2* | 8/2013 | Srinivasan | H03M 3/37 327/172 |
| 9,438,211 | B1* | 9/2016 | Chong | H03K 3/356104 |
| 10,447,290 | B2* | 10/2019 | Ghosh | H03M 1/089 |
| 10,491,205 | B2* | 11/2019 | Remple | G05F 1/565 |
| 2020/0021304 | A1* | 1/2020 | Wegberg | H03M 1/0863 |

* cited by examiner

*Primary Examiner* — Patrick O Neill
(74) *Attorney, Agent, or Firm* — McClure, Qualey & Rodack, LLP

(57) ABSTRACT

A clocked comparator includes a first clocked transconductance amplifier configured to receive a first voltage signal and output a first current signal to an internal node in accordance with a clock; a clocked regenerative load configured to enable a second voltage signal at the internal node to self-regenerate in accordance with the clock; a SR (set-reset) latch configured to receive the second voltage signal at the internal node and output a third voltage signal; and a second clocked transconductance amplifier configured to receive the third voltage signal and output a second current signal to the internal node.

20 Claims, 3 Drawing Sheets

HIGH-SENSITIVITY CLOCKED COMPARATOR AND METHOD THEREOF

BACKGROUND OF THE DISCLOSURE

Field of the Disclosure

The present disclosure generally relates to clocked comparator circuits and more particularly to clocked comparator circuits having reduced hysteresis and improved sensitivity.

Description of Related Art

As is known, a clocked comparator performs a sign detection on a voltage signal in accordance with a clock. Upon a low-to-high transition of the clock, the sign of the voltage signal is detected and represented by a decision embodied by a logical signal. When the clock returns to low, the decision is latched, awaiting an update upon a next low-to-high transition.

A schematic diagram of a prior art clocked comparator is shown in FIG. 1. Clocked comparator 100 comprises: a clocked common-source amplifier 110 comprising NMOS (n-channel metal oxide semiconductor) transistors 111, 113, and 114 and PMOS (p-channel metal oxide semiconductor) transistors 115 and 116, and configured to receive a first voltage signal $S_1$ (comprising two voltages $S_{1+}$ and $S_{1-}$ in a differential signal embodiment) and output a second voltage signal $S_2$ (comprising two voltages $S_{2+}$ and $S_{2-}$ in a differential signal embodiment) in accordance with a clock $V_{CK}$; a common-gate amplifier 120 comprising NMOS transistors 121 and 122 configured in a cross-coupling topology to receive the second voltage signal $S_2$ and output a third voltage signal $S_3$ (comprising two voltages $S_{3+}$ and $S_{3-}$ in a differential signal embodiment); a clocked regenerative load 130 comprising PMOS transistors 131, 132, 133, and 134 and configured as a load to the common-gate amplifier 120 for enabling the third voltage signal $S_3$ to self-regenerate in accordance with the clock $V_{CK}$; a SR (set-reset) latch 140 comprising NMOS transistors 141 and 142 and inverters 143, 144, 145, and 146 and configured to receive the third voltage signal $S_3$ and output a fourth voltage signal $S_4$ (comprising two voltages $S_{4+}$ and $S_{4-}$ in a differential signal embodiment).

Throughout this disclosure, "$V_{DD}$" denotes a power supply node. When the clock $V_{CK}$ is low, NMOS transistor 111 is turned off, and so are the clocked common-source amplifier 110 and the common-gate amplifier 120, while $S_{2+}$, $S_{2-}$, $S_{3+}$, and $S_{3-}$ are pulled high to "$V_{DD}$" by PMOS transistors 116, 115, 134, and 133, respectively, and as a result the second voltage signal $S_2$ and the third voltage signal $S_3$ are reset. Meanwhile, internal voltages $S_{5+}$ and $S_{5-}$ inside the SR latch 140 are low, NMOS transistors 141 and 142 are turned off, and $S_{4+}$, and $S_{4-}$ are latched to a previous state due to the cross-coupling of inverters 145 and 146. Upon a low-to-high transition of the clock $V_{CK}$, NMOS transistor 111 is turned on, PMOS transistors 115, 116, 133, and 134 are turned off, and the clocked common-source amplifier 110 is turned on to amplify a difference between $S_{1+}$ and $S_{1-}$ into a difference between $S_{2+}$ and $S_{2-}$; the common-gate amplifier 120 further amplifies the difference between $S_{2+}$ and $S_{2-}$ into a difference between $S_{3+}$ and $S_{3-}$ in a self-regenerating manner due to cross-coupling between NMOS transistors 121 and 122; the clocked regenerative load 130 further provides a positive feedback to reinforce the difference between $S_{3+}$ and $S_{3-}$ due to cross-coupling between PMOS transistors 131 and 132; and eventually $S_{3+}$ ($S_{3-}$) will be pulled up to "$V_{DD}$" by PMOS transistor 132 (131) and $S_{3-}$ ($S_{3+}$) will be pulled down to ground by NMOS transistor 121 (122) if $S_{1+}$ ($S_{1-}$) is higher than $S_{1-}$ ($S_{1+}$); a decision of $S_3$ is thus made, and the decision will be latched by the SR latch 140. Clocked common-source amplifier 110, common-gate amplifier 120, and clocked regenerative load 130 collectively embody a sampling latch known as a "strongARM latch," which is well known in the prior art and thus not further explained in detail here. Likewise, SR latch 140 is also well known in the prior art and thus not further explained in detail here.

The prior art clocked comparator 100 is subject to an issue known as hysteresis. Ideally, a present decision of $S_3$ should be solely determined by a sign of $S_{1+}-S_{1-}$ and has nothing to do with a previous decision of $S_3$. In practice, the present decision of $S_3$ will be wrong if the sign of $S_{1+}-S_{1-}$ is opposite to the previous decision and $|S_{1+}-S_{1-}|$ is smaller than a threshold known as a hysteresis level. For instance, if the hysteresis level is 10 mV and the previous decision is 1 (i.e., $S_{3+}$ is high and $S_{3-}$ is low), then the present decision will still be 1 unless $S_{1+}-S_{1-}$ is below −10 mV; if the hysteresis level is 15 mV and the previous decision is 0 (i.e. $S_{3+}$ is low and $S_{3-}$ is high), then the present decision will still be 0 unless $S_{1+}-S_{1-}$ is above 15 mV. In other words, the hysteresis can prevent the clocked comparator 100 from correctly detecting a sign of a small signal (i.e. $|S_{1+}-S_{1-}|$ is small). A sensitivity of the clocked comparator 100 is defined by the minimum level of $|S_{1+}-S_{1-}|$ needed for the clocked comparator 100 to correctly detect the sign of $S_{1+}-S_{1-}$. The sensitivity, therefore, is limited by the hysteresis.

The hysteresis results from an incomplete reset of the strongARM latch (comprising the clocked common-source amplifier 110, the common-gate amplifier 120, and the clocked regenerative load 130) that allows the previous decision to partly linger in $S_2$ and $S_3$. The incomplete reset is because PMOS transistors 116, 115, 134, and 133 are unable to pull $S_{2+}$, $S_{2-}$, $S_{3+}$, and $S_{3-}$, respectively to the exact voltage level of "$V_{DD}$" before a next low-to-high transition of the clock $V_{CK}$ arrives; this is inevitable in a high-speed clocked comparator where a duration of time in which the clock $V_{CK}$ stays low to allow PMOS transistors 116, 115, 134, and 133 to pull up $S_{2+}$, $S_{2-}$, $S_{3+}$, and $S_{3-}$ is short. To alleviate the hysteresis, one might consider increasing a width-to-length ratio of PMOS transistors 116, 115, 134, and 133 to make them more forceful in pulling up $S_{2+}$, $S_{2-}$, $S_{3+}$, and $S_{3-}$, respectively, to "$V_{DD}$"; however, doing so will also increase a parasitic capacitance that hinders the pull-up and thus may not be a workable solution.

What is desired is a method and apparatus for alleviating hysteresis and improving sensitivity of a clocked comparator.

BRIEF DESCRIPTION OF THIS DISCLOSURE

In an embodiment, a clocked comparator comprises: a first clocked transconductance amplifier configured to receive a first voltage signal and output a first current signal to an internal node in accordance with a clock; a clocked regenerative load configured to enable a second voltage signal at the internal node to self-regenerate in accordance with the clock; a SR (set-reset) latch configured to receive the second voltage signal at the internal node and output a third voltage signal; and a second clocked transconductance amplifier configured to receive the third voltage signal and output a second current signal to the internal node.

In an embodiment, a method comprises: converting a first voltage signal into a first current signal directed to an internal node using a first clocked transconductance amplifier controlled by a clock; enabling a second voltage signal at the internal node to self-regenerate and develop into a resolved state using a clocked regenerative load controlled by the clock; imposing the resolved state of the second voltage signal onto a third voltage signal using a SR (set-reset) latch; and converting the third voltage signal into a second current signal directed to the internal node using a second clocked transconductance amplifier controlled by the clock.

DETAILED DESCRIPTION OF THIS DISCLOSURE

Figure 1:
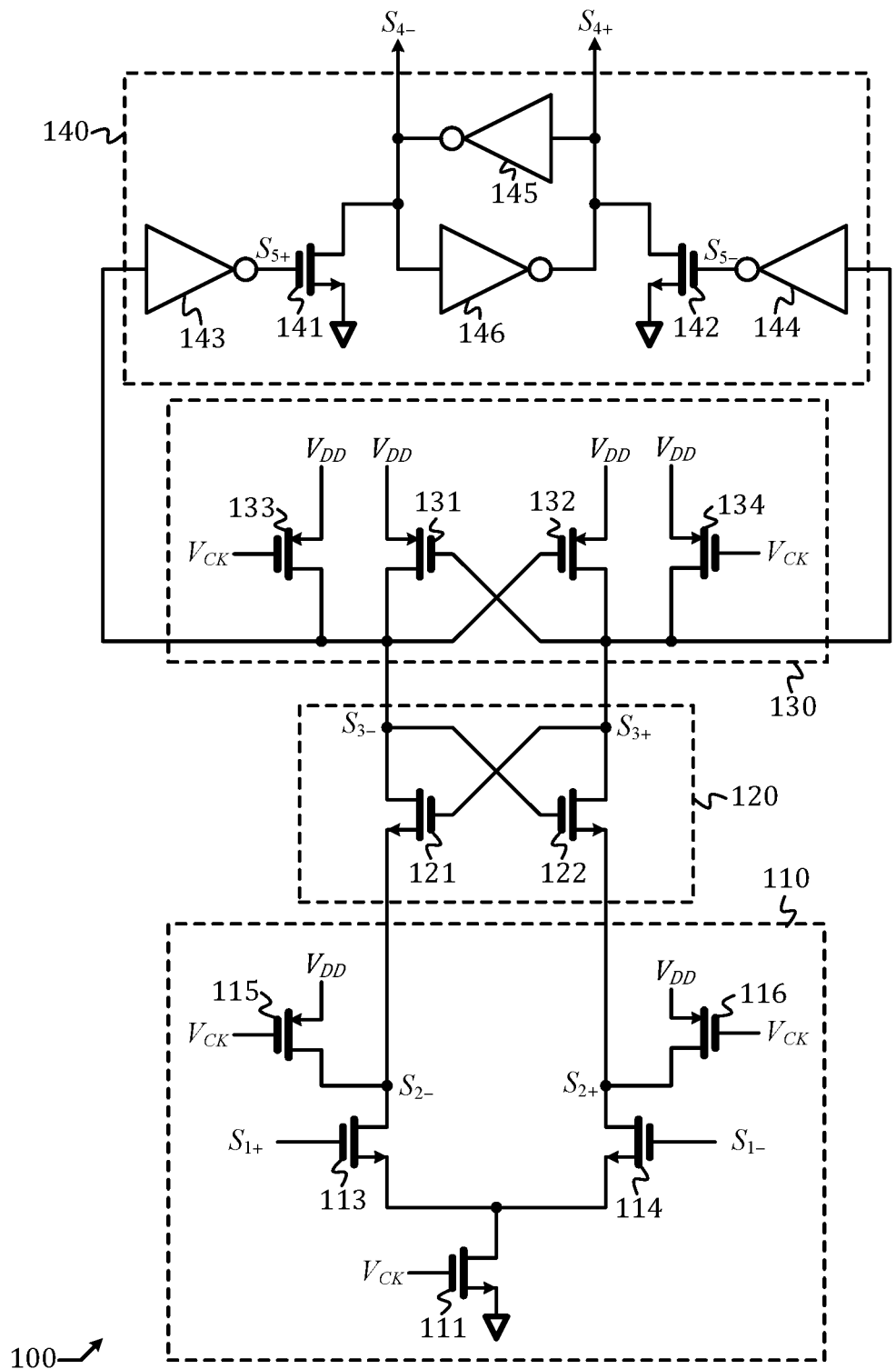
FIG. 1 shows a schematic diagram of a prior art clocked comparator.

The present disclosure is directed to clocked comparator circuits and methods. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "node," "signal," "clock," "comparator," "clocked comparator," "CMOS (complementary metal oxide semiconductor)," "NMOS (N-channel metal oxide semiconductor) transistor," "PMOS (N-channel metal oxide semiconductor) transistor," "single-ended signal," "differential signal," "differential pair," "pseudo-differential pair," "latch," "inverter," "SR (set-reset) latch" "common-source amplifier," "common-gate amplifier," "transconductance amplifier," "logical signal," "inverter," "pull up," and "pull down." Terms like these are used in a context of microelectronics, and the associated concepts are apparent to those of ordinary skills in the art and thus will not be explained in detail here. Those of ordinary skill in the art can also recognize a symbol of a NMOS transistor and a symbol of a PMOS transistor and identify the "source," the "gate," and the "drain" terminals thereof. Those of ordinary skills in the art also can read schematics of a circuit comprising NMOS transistors and/or PMOS transistors without the need of a verbose description about how one transistor connects with another in the schematics. Those of ordinary skills in the art also understand units such as micron and nanometer.

This present disclosure is disclosed in an engineering sense (e.g., from the perspective of one having ordinary skill in the art). For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

In this disclosure, a signal is either a voltage or a current that represents an information.

A "clock signal" (or simply a "clock") is a logical signal that cyclically toggles between a low state and a high state.

Throughout this disclosure, "$V_{DD}$" denotes a power supply node. For convenience, "$V_{DD}$" can also refer to a power supply voltage provided at the power supply node. That is, "$V_{DD}$ is 0.9V" means "a power supply voltage at the power supply node $V_{DD}$ is 0.9V." By way of example but not limitation, throughout this disclosure a circuit is fabricated using a 28 nm CMOS (complementary metal oxide semiconductor) process and $V_{DD}$ is 0.9V.

Throughout this disclosure, a differential signaling scheme is used. A differential voltage signal comprises two single-ended voltage signals denoted with suffixes "+" and "−," respectively, attached in subscript, and a value of the differential voltage signal is represented by a difference between said two single-ended voltages. For instance, $V_1$ ($V_2$, $V_3$, $V_4$, $V_5$, $V_6$) comprises $V_{1+}$ ($V_{2+}$, $V_{3+}$, $V_{4+}$, $V_{5+}$, $V_{6+}$) and $V_{1-}$ ($V_{2-}$, $V_{3-}$, $V_{4-}$, $V_{5-}$, $V_{6-}$) and a value of $V_1$ ($V_2$, $V_3$, $V_4$, $V_5$, $V_6$) is represented by a difference between $V_{1+}$ ($V_{2+}$, $V_{3+}$, $V_{4+}$, $V_{5+}$, $V_{6+}$) and $V_{1-}$ ($V_{2-}$, $V_{3-}$, $V_{4-}$, $V_{5-}$, $V_{6-}$). Likewise, a differential current signal comprises two currents denoted with suffixes "+" and "−," respectively, attached in subscript. For instance, $I_1$ ($I_2$) comprises $I_{1+}$ ($I_{2+}$) and $I_{1-}$ ($I_{2-}$) and a value of $I_1$ ($I_2$) is represented by a difference between $I_{1+}$ ($I_{2+}$) and $I_{1-}$ ($I_{2-}$). A circuit node pertaining to a differential voltage signal comprises two nodes denoted with suffixes "+" and "−," respectively, attached in subscript. For instance, circuit node 201 comprises nodes 201$_+$ and 201$_-$.

A single-ended logical signal is a single-ended voltage signal of two possible states: a high state and a low state. A single-ended logical signal is said to be in the high (low) state when a level of said single-ended logical signal is above (below) a certain trip point pertaining to said single-ended logical signal. When we state that "(the single-ended logical signal) X is high," we are stating it in a context of logical signal and what we mean is: "X is in the high state." When we state that (the single-ended logical signal) X is low," we are stating it in a context of logical signal and what we mean is: "X is in the low state." The high state is also known as the "1" state, and the low state is also known as the "0" state. When we state that "(the single-ended logical signal) X is 1," we are stating it in a context of logical signal and what we mean is: "X is in the high state." Likewise, when we state that "(the single-ended logical signal) X is 0," we are stating it in a context of logical signal and what we mean is: "X is in the low state."

A differential logical signal is made up of two single-ended logical signals including a first single-ended logical signal and a second single-ended logical signal and has three possible states: a "1" state, when the first single-ended logical signal is 1 and the second single-ended logical signal is 0; a "0" state, when the first single-ended logical signal is 0 and the second single-ended logical signal is 1; and a "null" state, when the first single-ended logical signal and the second single-ended signal are of the same state, either 1 or 0. The "null" state is an unresolved state, while both the "1" state and the "0" state are a resolved state.

For brevity, a signal, voltage or current, is simply referred to as a signal without explicitly specifying whether it is "differential" or "single-ended" if it is obvious to those of ordinary skill in the art from the context.

A PMOS (NMOS) transistor pair comprises a first PMOS (NMOS) transistor and a second PMOS (NMOS) transistor. The PMOS (NMOS) transistor pair is said to be "cross-coupling" if the drain of the first PMOS (NMOS) transistor connects to the gate of the second PMOS (NMOS) transistor, while the drain of the second PMOS (NMOS) transistor connects to the gate of the first PMOS (NMOS) transistor. A PMOS (NMOS) transistor pair configured in a cross-coupling topology exhibits a regenerative nature, as a positive feedback loop is formed.

Figure 2:
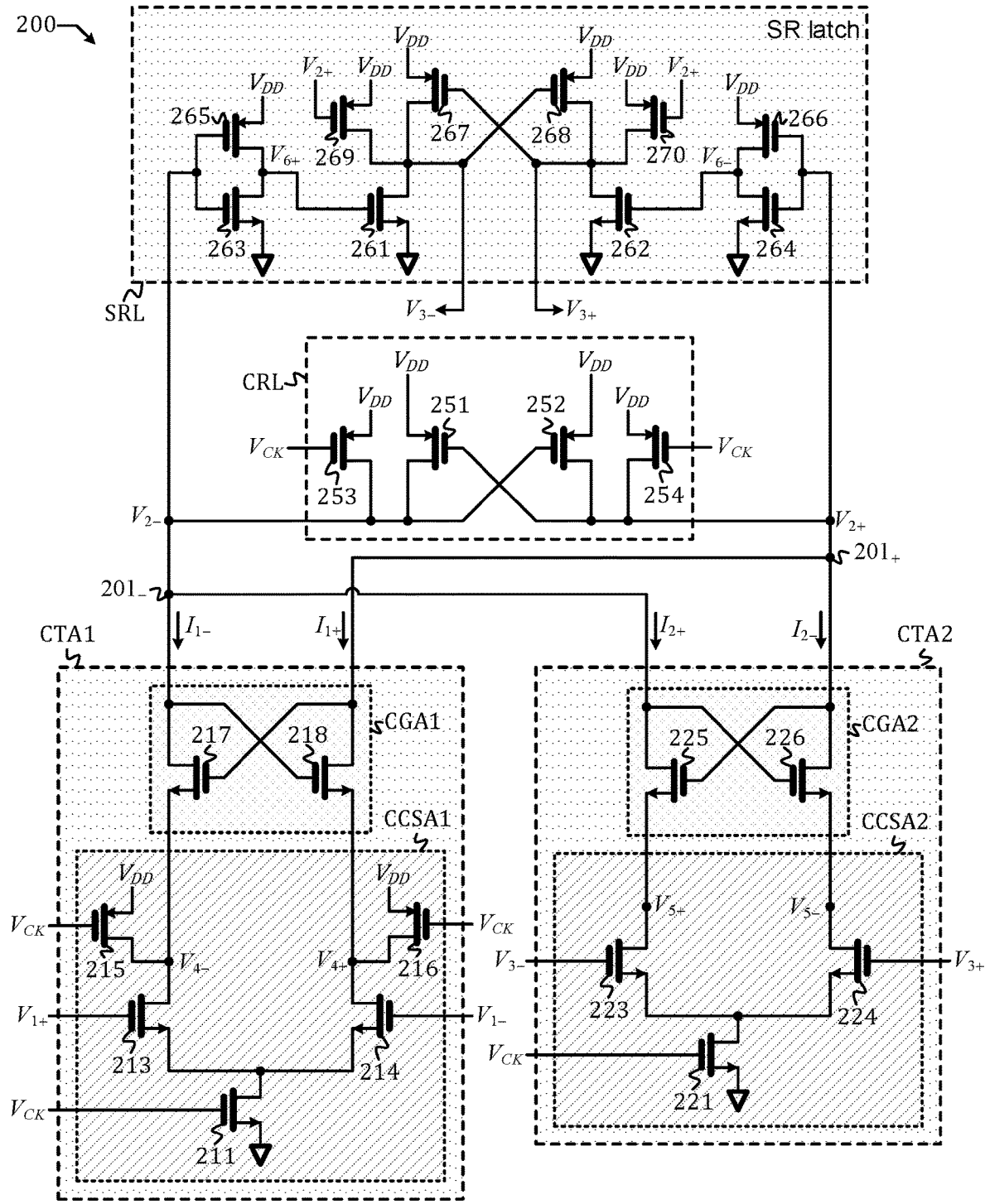
FIG. 2 shows a schematic diagram of a clocked comparator in accordance with an embodiment of the present disclosure.

A schematic diagram of a clocked comparator 200 in accordance with an embodiment of the present disclosure is shown in FIG. 2. Clocked comparator 200 comprises: a first clocked transconductance amplifier CTA1 configured to receive a first voltage signal $V_1$ and output a first current signal $I_1$ to an internal node 201, at which a second voltage signal $V_2$ is established, in accordance with a clock $V_{CK}$; a clocked regenerative load CRL configured to provide a regenerative load at the internal node 201 in accordance with the clock $V_{CK}$; a SR (set-reset) latch SRL configured to receive the second voltage signal $V_2$ from the internal node 201 and output a third voltage signal $V_3$; and a second clocked transconductance amplifier CTA2 configured to receive the third voltage signal $V_3$ and output a second current signal $I_2$ to the internal node 201. When the clock $V_{CK}$ is low, the first clocked transconductance amplifier CTA1 and the second clocked transconductance amplifier CTA2 are in a reset state, wherein $I_1$ and $I_2$ are all reset to zero, $V_2$ is reset to null, and $V_3$ is latched at a previous state. Upon a low-to-high transition of the clock $V_{CK}$, the first clocked transconductance amplifier CTA1 outputs $I_1$ in accordance with $V_1$, the second clocked transconductance amplifier CTA2 outputs $I_2$ in accordance with $V_3$, the clocked regenerative load CRL enables $V_2$ to self-regenerate into a resolved state in accordance with a sum of $I_1$ and $I_2$, and the SR latch SRL latches $V_2$ into $V_3$ once $V_2$ develops into the resolved state.

The first clocked transconductance amplifier CTA1 comprises a first clocked common-source amplifier CCSA1 configured to receive the first voltage signal $V_1$ and output a fourth voltage signal $V_4$ in accordance with the clock $V_{CK}$, and a first common-gate amplifier CGA1 configured to receive the fourth voltage signal $V_4$ and output the first current signal $I_1$ to the internal node 201. The second clocked transconductance amplifier CTA2 comprises a second clocked common-source amplifier CCSA2 configured to receive the third voltage signal $V_3$ and output a fifth voltage signal $V_5$ in accordance with the clock $V_{CK}$, and a second common-gate amplifier CGA2 configured to receive the fifth voltage signal $V_5$ and output the second current signal $I_2$ to the internal node 201. For brevity, hereafter the first clocked transconductance amplifier CTA1 is simply referred to as CTA1, the second clocked transconductance amplifier CTA2 is simply referred to as CTA2, the first clocked common-source amplifier CCSA1 is simply referred to as CCSA1, the second clocked common-source amplifier CCSA2 is simply referred to as CCSA2, the first common-gate amplifier CGA1 is simply referred to as CGA1, the second common-gate amplifier CGA2 is simply referred to as CGA2, the clocked regenerative load CRL is simply referred to as CRL, the SR latch SRL is simply referred to as SRL, the first (second, third, fourth, fifth) voltage signal $V_1$ ($V_2$, $V_3$, $V_4$, $V_5$) is simply referred to as $V_1$ ($V_2$, $V_3$, $V_4$, $V_5$), and the first (second) current signal $I_1$ ($I_2$) is simply referred to as $I_1$ ($I_2$). From the context of FIG. 2, it is understood by those of ordinary skill in the art that $V_1$, $V_2$, $V_3$, $V_4$, $V_5$, $I_1$, and $I_2$ are all differential signals and thus the term "differential" is dropped herein for brevity.

The clocked comparator 200 works in a two-phase manner in accordance with the clock $V_{CK}$. When the clock $V_{CK}$ is low, the clocked comparator 200 is in a frozen phase, wherein $V_2$, which is a differential logical signal, is reset to a null state and $V_3$, which is also a differential logical signal, is latched to a previous state. Upon a low-to-high transition of the clock $V_{CK}$, the clocked comparator 200 enters in a resolving phase, wherein $V_2$ is resolved and changes from the null state into either the "1" state or the "0" state in accordance with a sign of $V_1$, and then the state of $V_2$ is latched into a present state of $V_3$. In the resolving phase, once $V_2$ is resolved, $V_2$ represents a decision of a sign of $V_1$, which is either "1" (if $V_{2+}$ is high and $V_{2-}$ is low, indicating the sign of $V_1$ is positive) or "0" (if $V_{2+}$ is low and $V_{2-}$ is high, indicating the sign of $V_1$ is negative). Note that when both $V_{2+}$ and $V_{2-}$ are high, $V_2$ is in an unresolved state. After $V_2$ is resolved to either the "1" or the "0" state, the state will be loaded into a state of $V_3$ by SRL.

CCSA1 comprises NMOS transistors 211, 213, and 214, and PMOS transistors 215 and 216. NMOS transistors 213 and 214 form a differential pair, which is biased via NMOS transistor 211 controlled by the clock $V_{CK}$, and are configured to receive $V_{1+}$ and $V_{1-}$ and output $V_{4-}$ and $V_{4+}$, respectively. CGA1 comprises NMOS transistors 217 and 218 configured in a cross-coupling topology to receive $V_{4-}$ and $V_{4+}$ and output $I_{1-}$ and $I_{1+}$ to nodes $201_-$ and $201_+$, respectively. When the clock $V_{CK}$ is low, NMOS transistor 211 is turned off, causing NMOS transistors 213 and 214 to be turned off and allowing PMOS transistors 215 and 216 to pull up $V_{4-}$ and $V_{4+}$, respectively, to "$V_{DD}$" without resistance, and consequently NMOS transistors 217 and 218 are also turned off. Upon a low-to-high transition of the clock $V_{CK}$, NMOS transistor 211 is turned on and PMOS transistors 215 and 216 are turned off, allowing the differential pair formed by NMOS transistors 213 and 214 to pull down $V_{4-}$ and $V_{4+}$ in accordance with $V_{1+}$ and $V_{1-}$, respectively: if $V_{1+}$ is higher than $V_{1-}$, $V_{4-}$ will fall down faster than $V_{4+}$ and causes $I_{1-}$ to be greater than $I_{1+}$, otherwise $V_{4+}$ will fall down faster than $V_{4-}$ and causes $I_{1+}$ to be greater than $I_{1-}$.

Verbose descriptions regarding connections among circuit elements and/or signals in FIG. 2 such as "the source, the gate, and the drain of PMOS transistor 215 connect to $V_{DD}$, $V_{CK}$, and $V_{4-}$." are omitted since they are understood to those of ordinary skill in the art.

CCSA2 comprises NMOS transistors 221, 223, and 224. NMOS transistors 223 and 214 form a differential pair, which is biased via NMOS transistor 221 controlled by the clock $V_{CK}$, and are configured to receive $V_{3-}$ and $V_{3+}$ and output $V_{5+}$ and $V_{5-}$, respectively. CGA2 comprises NMOS transistors 225 and 226 configured in a cross-coupling topology to receive $V_{5+}$ and $V_{5-}$ and output $I_{2+}$ and $I_{2-}$ to nodes $201_-$ and $201_+$, respectively. When the clock $V_{CK}$ is low, NMOS transistor 221 is turned off, causing NMOS transistors 223 and 224 to be turned off and consequently NMOS transistors 225 and 226 are also turned off. Upon a low-to-high transition of the clock $V_{CK}$, NMOS transistor 221 is turned on, allowing the differential pair formed by NMOS transistors 223 and 224 to pull down $V_{5+}$ and $V_{5-}$ in accordance with $V_{3-}$ and $V_{3+}$, respectively: if $V_{3-}$ is higher than $V_{3+}$, $V_{5+}$ will fall down faster than $V_{5-}$ and cause $I_{2+}$ to be greater than $I_{2-}$, otherwise $V_{5-}$ will fall down faster than $V_{5+}$ and cause $I_{2-}$ to be greater than $I_{2+}$.

CRL comprises PMOS transistors 251, 252, 253, and 254. PMOS transistors 251 and 252 are configured in a cross-coupling topology to provide a regenerative load across nodes $201_+$ and $201_-$. PMOS transistors 253 and 254 are controlled by the clock $V_{CK}$. When the clock $V_{CK}$ is low, $V_{2-}$ and $V_{2+}$ are pulled up to "$V_{DD}$" by PMOS transistors 253 and 254, respectively, causing PMOS transistors 251 and 252 to be turned off. In the meanwhile, $I_{1+}$, $I_{1-}$, $I_{2+}$, and $I_{2-}$ are zero because NMOS transistors 217, 218, 225, and 226 are turned off, as explained earlier. Upon a low-to-high transition of the clock $V_{CK}$, PMOS transistors 253 and 254 are turned off, $V_{4-}$, $V_{4+}$, $V_{5+}$, and $V_{5-}$ starts falling down, causing $I_{1+}$, $I_{1-}$, $I_{2+}$, and $I_{2-}$ to rise and both $V_{2-}$ and $V_{2+}$ to fall down. If $I_{1-}+I_{2+}$ is greater than $I_{1+}+I_{2-}$, $V_{2-}$ will fall faster than $V_{2+}$, and once falling sufficiently low it will turn off NMOS transistors 218 and 226, thus shutting off $I_{1+}$ and $I_{2-}$ and prevent $V_{2+}$ to fall; eventually, $V_{2-}$ will fall to nearly ground and at the same time pull up $V_{2+}$ to nearly "$V_{DD}$" via PMOS transistor 252. On the other hand, if $I_{1+}+I_{2-}$ is greater than $I_{1-}+I_{2+}$, $V_{2+}$ will fall faster than $V_{2-}$, and once falling sufficiently low it will turn off NMOS transistors 217 and 225, thus shutting off $I_{1-}$ and $I_{2+}$ and prevent $V_{2-}$ to fall; eventually, $V_{2+}$ will fall to nearly ground and at the same time pull up $V_{2-}$ to nearly "$V_{DD}$" via PMOS transistor 251. A resolved state of $V_2$ of either "1" ($V_{2+}$ is high and $V_{2-}$ is low) or "0" ($V_{2+}$ is low and $V_{2-}$ is high) thus emerges, and it's determined by which of the two currents, $I_{1-}+I_{2+}$ and $I_{1+}+I_{2-}$, is greater upon the low-to-high transition of the clock $V_{CK}$. Once the state of $V_2$ is resolved, it is latched into a state of $V_3$ by SRL.

SRL comprises an inverter pair comprising a first inverter made up of NMOS transistor 263 and PMOS transistor 265 and a second inverter made up of NMOS transistor 264 and PMOS transistor 266; a first pseudo-differential pair comprising NMOS transistors 261 and 262; and a cross-coupling pair comprising PMOS transistors 267 and 268. The inverter pair receives $V_2$ and output a sixth voltage signal $V_6$ (which is a differential logical signal comprising $V_{6+}$ and $V_{6-}$). The first pseudo-differential pair made up of NMOS transistors 261 and 262 receives the sixth voltage signal $V_6$ and outputs $V_3$. The cross-coupling pair made up of PMOS transistors 267 and 268 is used to latch a state of $V_3$. If the state of $V_2$ is "1," the sixth voltage signal $V_6$ will be "1" (i.e. $V_{6+}$ is high and $V_{6-}$ is low), and $V_3$ will be latched to "1." If the state of $V_2$ is "0," the sixth voltage signal $V_6$ will be "0" (i.e. $V_{6+}$ is low and $V_{6-}$ is high), and the state of $V_3$ will be latched to "0." In a further embodiment, SRL further comprises a second pseudo-differential pair comprising PMOS transistors 269 and 270 configured to receive $V_2$ and outputs $V_3$ jointly with the first pseudo-differential pair made up of NMOS transistors 261 and 262. This further embodiment can increase a speed of SRL, as the second pseudo-differential pair can directly impose a resolved state of $V_2$ onto $V_3$.

If CTA2 were removed, clocked comparator 200 is not much different from the prior art clocked comparator 100 of FIG. 1. With the inclusion CTA2, however, the hysteresis issue in the prior art clocked comparator 100 mentioned earlier is advantageously alleviated. Upon a low-to-high transition of the clock $V_{CK}$, CTA1 outputs $I_1$ in accordance with $V_1$ to resolve $V_2$, while CTA2 outputs $I_2$ in accordance with $V_3$ to participate in the resolving of $V_2$, wherein $V_3$ is a previous resolved state of $V_2$ as latched by SRL. However, $I_2$ is summed with $I_1$ with an opposite polarity (since $I_{2-}$ is summed with $I_{1+}$ at node $201_+$, while $I_{2+}$ is summed with $I_{1-}$ at node 2014, and CTA2 and SRL forms a negative feedback. If $V_3$ is "1," $I_2$ will be negative (i.e. $I_{2-}$ is greater than $I_{2+}$) and helping to resolve $V_2$ into "0" (i.e. $V_{2+}$ is low and $V_{2-}$ is low) and consequently toggle $V_3$ to "1." On the other hand, if $V_3$ is "0," $I_2$ will be positive (i.e. $I_{2+}$ is greater than $I_{2-}$) and helping to resolve $V_2$ into "1" (i.e. $V_{2+}$ is high and $V_{2-}$ is low) and consequently toggle $V_3$ to "0." The hysteresis makes it harder for $V_3$ to toggle, while the negative feedback makes it easier for $V_3$ to toggle. The hysteresis issue is thus alleviated.

Caution must be taken, however, about using CTA2, which is used to alleviate hysteresis of CTA1 when $|V_{1+}-V_{1-}|$ is small but should not dominate over CTA1 when $|V_{1+}-V_{1-}|$ is large. To prevent CTA2 from dominating over CTA1, a transconductance of CTA2 must be smaller than a transconductance of CTA1.

By way of example but not limitation: the dimensions are devices in FIG. 2 are shown in the following table.

| Devices | Width (in microns) | Length (in nanometers) |
|---|---|---|
| NMOS transistor 211 | 2.88 | 30 |
| NMOS transistors 213 & 214 | 3.84 | 30 |
| PMOS transistors 215 & 216 | 0.48 | 30 |
| NMOS transistors 217 & 218 | 3.84 | 30 |
| NMOS transistor 221 | 0.48 | 30 |
| NMOS transistors 223 & 224 | 0.24 | 30 |
| NMOS transistors 225 & 226 | 0.12 | 30 |
| PMOS transistors 251, 252, 253, & 254 | 1.92 | 30 |
| NMOS transistors 263 & 264 | 0.12 | 30 |
| PMOS transistors 265 & 266 | 0.72 | 30 |
| NMOS transistors 261 & 262 | 0.36 | 30 |
| PMOS transistors 267 & 268 | 0.12 | 30 |
| PMOS transistors 269 & 270 | 0.48 | 30 |

It is clear that width-to-length ratios of transistors in CTA2 are smaller than those in CTA1. This way, a transconductance of CTA2 is smaller than a transconductance of CTA1, and therefore CTA2 will not dominate over CTA1.

Figure 3:
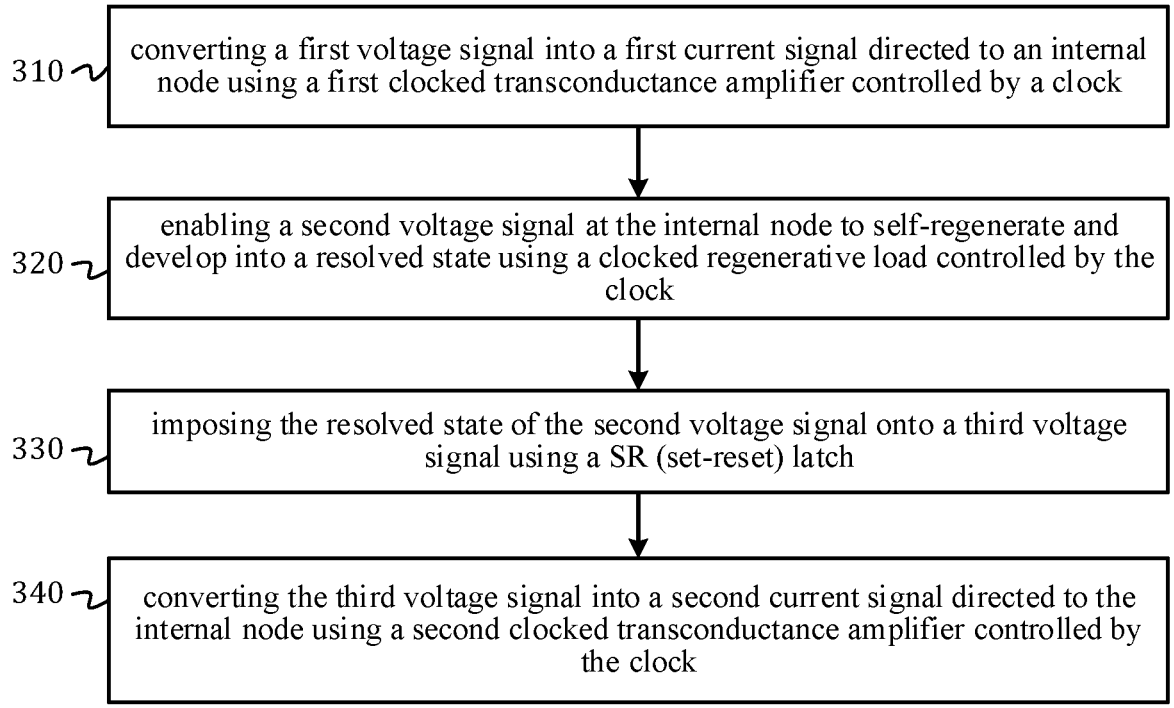
FIG. 3 shows a flow diagram of a method in accordance with an embodiment of the present disclosure.

As shown in a flow diagram depicted in FIG. 3, a method in accordance with an embodiment of the present disclosure comprises the following steps: (step 310) converting a first voltage signal into a first current signal directed to an internal node using a first clocked transconductance amplifier controlled by a clock; (step 320) enabling a second voltage signal at the internal node to self-regenerate and develop into a resolved state using a clocked regenerative load controlled by the clock; (step 330) imposing the resolved state of the second voltage signal onto a third voltage signal using a SR (set-reset) latch; and (step 340) converting the third voltage signal into a second current signal directed to the internal node using a second clocked transconductance amplifier controlled by the clock.

This present disclosure can be very useful in a high-speed serial link receiver, wherein a decision must be resolved within a very short period and thus often highly hindered by hysteresis.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A clocked comparator comprising:
   a first clocked transconductance amplifier configured to receive a first voltage signal and output a first current signal to an internal node in accordance with a clock;
   a clocked regenerative load configured to enable a second voltage signal at the internal node to self-regenerate in accordance with the clock;
   a SR (set-reset) latch configured to receive the second voltage signal at the internal node and output a third voltage signal; and
   a second clocked transconductance amplifier configured to receive the third voltage signal and output a second current signal to the internal node.

2. The clocked comparator of claim 1, wherein the third voltage signal conforms to the same state of the second voltage signal when the second voltage is in a resolved state, and otherwise remains in a previous state.

3. The clocked comparator of claim 2, wherein the first clocked transconductance amplifier comprises a first clocked common-source amplifier configured to receive the first voltage signal and output a fourth voltage signal in accordance with the clock, and a first common-gate amplifier configured to receive the fourth voltage signal and output the first current signal.

4. The clocked comparator of claim 3, wherein the first common-gate amplifier is of a cross-coupling topology.

5. The clocked comparator of claim 4, wherein: the second clocked transconductance amplifier comprises a second clocked common-source amplifier configured to receive the third voltage signal and output a fifth voltage signal in accordance with the clock, and a second common-gate amplifier configured to receive the fifth voltage signal and output the second current signal.

6. The clocked comparator of claim 5, wherein the second common-gate amplifier is of a cross-coupling topology.

7. The clocked comparator of claim 6, wherein when the clock is in a first logical state, the first clocked common-source amplifier and the second clocked common-source amplifier are turned off, consequently turning off the first common-gate amplifier and the second common-gate amplifier and zeroing the first current signal and the second current signal, the clocked regenerative load is turned off, and the second voltage signal is reset to a null state.

8. The clocked comparator of claim 7, wherein upon a transition of the clock from the first logical state to a second logical state, the first clocked common-source amplifier and the second clocked common-source amplifier are turned on to develop the fourth voltage signal and the fifth voltage signal in accordance with the first voltage signal and the third voltage signal and consequently develop the first current signal and the second current signal via the first common-gate amplifier and the second common-gate amplifier, respectively, and the second voltage signal develops in accordance with the first current signal and the second current signal and self-regenerates into a resolved state.

9. The clocked comparator of claim 2, wherein the SR latch and the second clocked transconductance amplifier forms a negative feedback to help toggling a state of the third voltage signal upon the transition of the clock from a first logical state to a second logical state.

10. The clocked comparator of claim 9, wherein the first current signal and the second current signal are summed at the internal node with opposite polarity.

11. A method comprising:
converting a first voltage signal into a first current signal directed to an internal node using a first clocked transconductance amplifier controlled by a clock;
enabling a second voltage signal at the internal node to self-regenerate and develop into a resolved state using a clocked regenerative load controlled by the clock;
imposing the resolved state of the second voltage signal onto a third voltage signal using a SR (set-reset) latch; and
converting the third voltage signal into a second current signal directed to the internal node using a second clocked transconductance amplifier controlled by the clock.

12. The method of claim 11, wherein the third voltage signal conforms to the same state of the second voltage signal when the second voltage is in a resolved state, and otherwise remains in a previous state.

13. The method of claim 12, wherein the first clocked transconductance amplifier comprises a first clocked common-source amplifier configured to receive the first voltage signal and output a fourth voltage signal in accordance with the clock, and a first common-gate amplifier configured to receive the fourth voltage signal and output the first current signal.

14. The method of claim 13, wherein the first common-gate amplifier is of a cross-coupling topology.

15. The method of claim 14, wherein: the second clocked transconductance amplifier comprises a second clocked common-source amplifier configured to receive the third voltage signal and output a fifth voltage signal in accordance with the clock, and a second common-gate amplifier configured to receive the fifth voltage signal and output the second current signal.

16. The method of claim 15, wherein the second common-gate amplifier is of a cross-coupling topology.

17. The method of claim 16, wherein when the clock is in a first logical state, the first clocked common-source amplifier and the second clocked common-source amplifier are turned off, consequently turning off the first common-gate amplifier and the second common-gate amplifier and zeroing the first current signal and the second current signal, the clocked regenerative load is turned off, and the second voltage signal is reset to a null state.

18. The method of claim 17, wherein upon a transition of the clock from the first logical state to a second logical state, the first clocked common-source amplifier and the second clocked common-source amplifier are turned on to develop the fourth voltage signal and the fifth voltage signal in accordance with the first voltage signal and the third voltage signal and consequently develop the first current signal and the second current signal via the first common-gate amplifier and the second common-gate amplifier, respectively, and the second voltage signal develops in accordance with the first current signal and the second current signal and self-regenerates into a resolved state.

19. The method of claim 12, wherein the SR latch and the second clocked transconductance amplifier forms a negative feedback to help toggling a state of the third voltage signal upon the transition of the clock from a first logical state to a second logical state.

20. The method of claim 19, wherein the first current signal and the second current signal are summed at the internal node with opposite polarity.

* * * * *